(12) United States Patent
Kim et al.

(10) Patent No.: US 10,994,950 B2
(45) Date of Patent: May 4, 2021

(54) AUTOMATED GUIDED VEHICLE WITH MULTISTAGE LOADING STRUCTURE

(71) Applicant: SAMSUNG ELECTRONICS CO., LTD., Suwon-si (KR)

(72) Inventors: Bosung Kim, Chungcheongnam-do (KR); Gwanho Kim, Chungcheongnam-do (KR); Seonghoon Park, Seoul (KR); Jaenam Lee, Chungcheongnam-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 157 days.

(21) Appl. No.: 16/167,178

(22) Filed: Oct. 22, 2018

(65) Prior Publication Data

US 2019/0270601 A1    Sep. 5, 2019

(30) Foreign Application Priority Data

Mar. 2, 2018   (KR) ......................... 10-2018-0025255

(51) Int. Cl.
| | |
|---|---|
| *H01L 21/677* | (2006.01) |
| *B65G 47/90* | (2006.01) |
| *B65G 65/00* | (2006.01) |
| *H01L 21/687* | (2006.01) |
| *H01L 21/673* | (2006.01) |

(52) U.S. Cl.
CPC .......... *B65G 47/907* (2013.01); *B65G 65/00* (2013.01); *H01L 21/67346* (2013.01); *H01L 21/67724* (2013.01); *H01L 21/67736* (2013.01); *H01L 21/67778* (2013.01); *H01L 21/67781* (2013.01); *H01L 21/68707* (2013.01); *B65G 2201/0297* (2013.01)

(58) Field of Classification Search
CPC ........................ H01L 21/67724; B23Q 7/1436
See application file for complete search history.

(56) References Cited

U.S. PATENT DOCUMENTS

| | | | | | |
|---|---|---|---|---|---|
| 5,364,219 | A | * | 11/1994 | Takahashi | ......... H01L 21/67724 |
| | | | | | 118/719 |
| 6,089,812 | A | * | 7/2000 | Junker | ................. B23Q 7/1436 |
| | | | | | 414/396 |
| 6,838,892 | B2 | * | 1/2005 | Suzuki | ................. B23Q 7/1442 |
| | | | | | 324/756.01 |
| 7,044,703 | B2 | * | 5/2006 | Fukuda | ............. H01L 21/67294 |
| | | | | | 414/416.03 |
| 7,153,079 | B2 | * | 12/2006 | Miyano | ............. H01L 21/67092 |
| | | | | | 414/416.01 |

(Continued)

FOREIGN PATENT DOCUMENTS

| | | |
|---|---|---|
| KR | 1020070118376 A | 12/2007 |
| KR | 100896472 B1 | 5/2009 |

(Continued)

*Primary Examiner* — Mark C Hageman
(74) *Attorney, Agent, or Firm* — Volentine, Whitt & Francos, PLLC

(57) ABSTRACT

An automated guided vehicle with a multistage loading structure includes a vehicle body, and a loader in the vehicle body and operative to load articles in a multistage manner. The loader has a loading unit that is positioned between the articles loaded in the multistage manner and separately loads the articles. The loading unit moves up and down.

15 Claims, 15 Drawing Sheets

(56) References Cited

U.S. PATENT DOCUMENTS

| | | | |
|---|---|---|---|
| 7,311,488 B2 * | 12/2007 | Park | H01L 21/67724 |
| | | | 414/663 |
| 7,942,619 B2 * | 5/2011 | Hashimoto | H01L 21/67766 |
| | | | 414/217 |
| 9,190,304 B2 * | 11/2015 | MacKnight | H01L 21/67724 |
| 10,160,469 B2 * | 12/2018 | Grou | B62B 5/0495 |
| 10,340,167 B2 * | 7/2019 | Yoo | H01L 21/67769 |
| 10,427,434 B2 * | 10/2019 | Atwood | B41J 29/06 |
| 2017/0066592 A1 | 3/2017 | Bestian, II et al. | |

FOREIGN PATENT DOCUMENTS

| | | |
|---|---|---|
| KR | 101015228 B1 | 2/2011 |
| KR | 101570071 B1 | 11/2015 |

* cited by examiner

AUTOMATED GUIDED VEHICLE WITH MULTISTAGE LOADING STRUCTURE

PRIORITY STATEMENT

This U.S. nonprovisional application claims priority under 35 U.S.C. § 119 to Korean Patent Application No. 10-2018-0025255 filed on Mar. 2, 2018, in the Korean Intellectual Property Office, the entire contents of which are hereby incorporated by reference.

BACKGROUND

The inventive concept relates to an automated guided vehicle. More particular, the inventive concept relates to an automated vehicle having a loader/unloader for loading articles onto and/or unloading articles from a body of the vehicle.

The demand for semiconductor devices is continuously increasing due to the development of information and communication technologies. To meet such extreme demands, new fabrication lines for manufacturing and transporting semiconductor devices must be built and these lines must minimize production time.

The easiest way of building new fabrication lines is to secure a wide area of a factory in which the pieces of equipment (or "fabrication facilities") of the lines can be laid out, but this incurs high overhead costs which are passed down to the final products. Laying out the production lines in a large area also results in a correspondingly long production time. It thus is desirable to place the fabrication lines within as small an area as possible.

That is, to realize an efficient manufacturing facility, i.e., to minimize the production time and allow for processed articles to be promptly delivered from one fabrication line to another, it is important to minimize the space between the fabrication lines. However, the need to secure paths along which the processed articles must be transferred along the fabrication lines limits a reduction in the spacing between the fabrication lines.

Various automation systems have been developed to deliver goods between fabrication lines. An automated guided vehicle (AGV) and an overhead hoist transport (OHT) that travel along a linear rail installed on a ceiling is an example of one widely used automation system. Many other automation systems are also being studied.

SUMMARY

According to the inventive concept, there is provided an automated guided vehicle comprising a vehicle body, a loader in the vehicle body and comprising a plurality of article supports configured to support articles, respectively, the plurality of article supports including at least one loading unit, and in which the loader further comprises a respective elevating unit operably connected to each said at least one loading unit and operative to move the loading unit up and down in the vehicle body, and the loading unit is positionable by the elevating unit in the vehicle body over another of the article supports in the vehicle body such that the loading unit will be interposed between an article supported thereon in the vehicle body and another article supported on said another of the article supports in the vehicle body. Therefore, articles are loadable into the automated guided vehicle in multiple stages.

According to the inventive concept, there is provided an automated guided vehicle comprising a vehicle body, a loader in the vehicle body and comprising a plurality of article supports configured to support articles, respectively, the plurality of article supports including at least one loading unit; and a rotation unit operatively connected to the loader to rotate the loader relative to the vehicle body. The loader further comprises a respective elevating unit operably connected to each loading unit and operative to move the loading unit(s) up and down in the vehicle body. Also, the loading unit is positionable by the elevating unit in the vehicle body over another of the article supports in the vehicle body. Therefore, articles are loadable into the automate guided vehicle in multiple stages.

According to the inventive concept, there is also provided a manufacturing system comprising a combination of an automated guided vehicle and a fabrication line including fabrication facilities spaced from each other in a first direction along which the automated guided vehicle is guided to and from locations at which articles are loaded onto the automated guided vehicle from the fabrication facilities and/or unloaded from the automated guided vehicle to the fabrication facilities. The automated guided vehicle includes a vehicle body, and a loader on the vehicle body, the loader comprising a positioning means. The at least one of the fabrication facilities has a counter-positioning means in the vicinity of a respective one of the loading/unloading locations. The positioning means of the loader is engageable with the counter-positioning means when the automated guided vehicle is at said respective one of the locations.

According to the inventive concept, there is provided an automated guided vehicle comprising a vehicle body including a vehicle drive mechanism, and a housing supported by the vehicle drive mechanism, a loader disposed in the housing of the vehicle body and supported so as to be movable up and down relative the housing, a rotation unit operatively connected to the loader to rotate the loader relative to the vehicle body, and a height adjuster that adjusts the height of the loader. The height adjuster includes at least one flexible member connected to a top of and supporting the loader so as to allow the loader to move freely back and forth and side to side to certain extents within the housing of the vehicle body. The loader comprises a loading unit configured to support an article to be delivered by or received from a fabrication line, an elevating unit operatively connected to the loading unit and operative to move the loading unit up and down in the housing, and positioning means for fixing the loader in position relative to a facility from which the automated vehicle is receiving an article from or delivering an article to.

DETAILED DESCRIPTION

Figure 1:
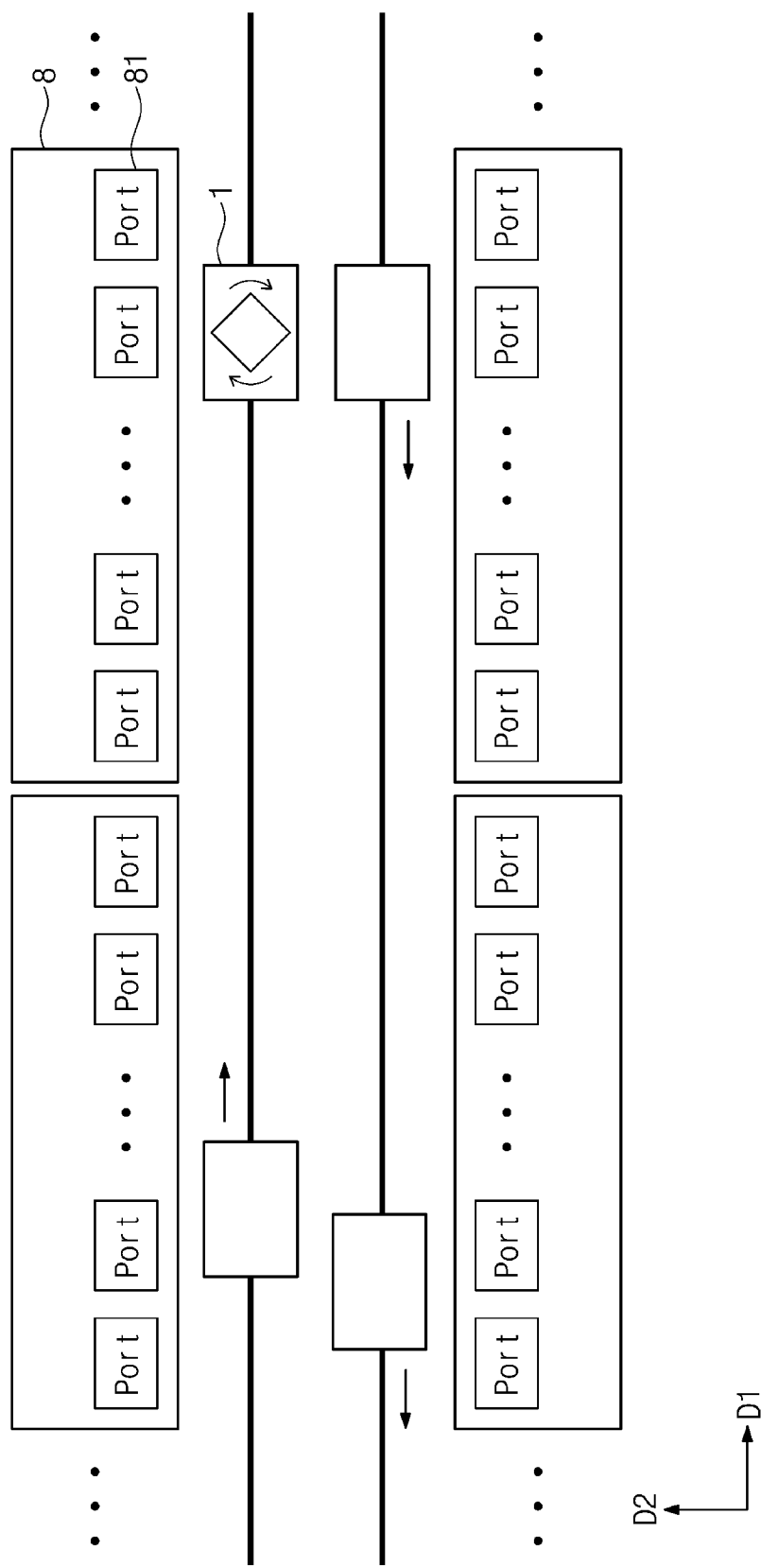
FIG. 1 is a schematic plan view of a manufacturing facility having fabrication lines and automated guided vehicles according to the inventive concept.

Examples of the inventive concept will now be described in detail in the following with reference to the accompanying drawings. Like reference numerals may indicate like components throughout the drawings.

FIG. 1 shows a layout of equipment 8 (referred to hereinafter as "fabrication facilities") used in the manufacturing of certain articles, e.g., semiconductor devices, and a plurality of automated guided vehicles 1 according to the inventive concept.

Figure 2:
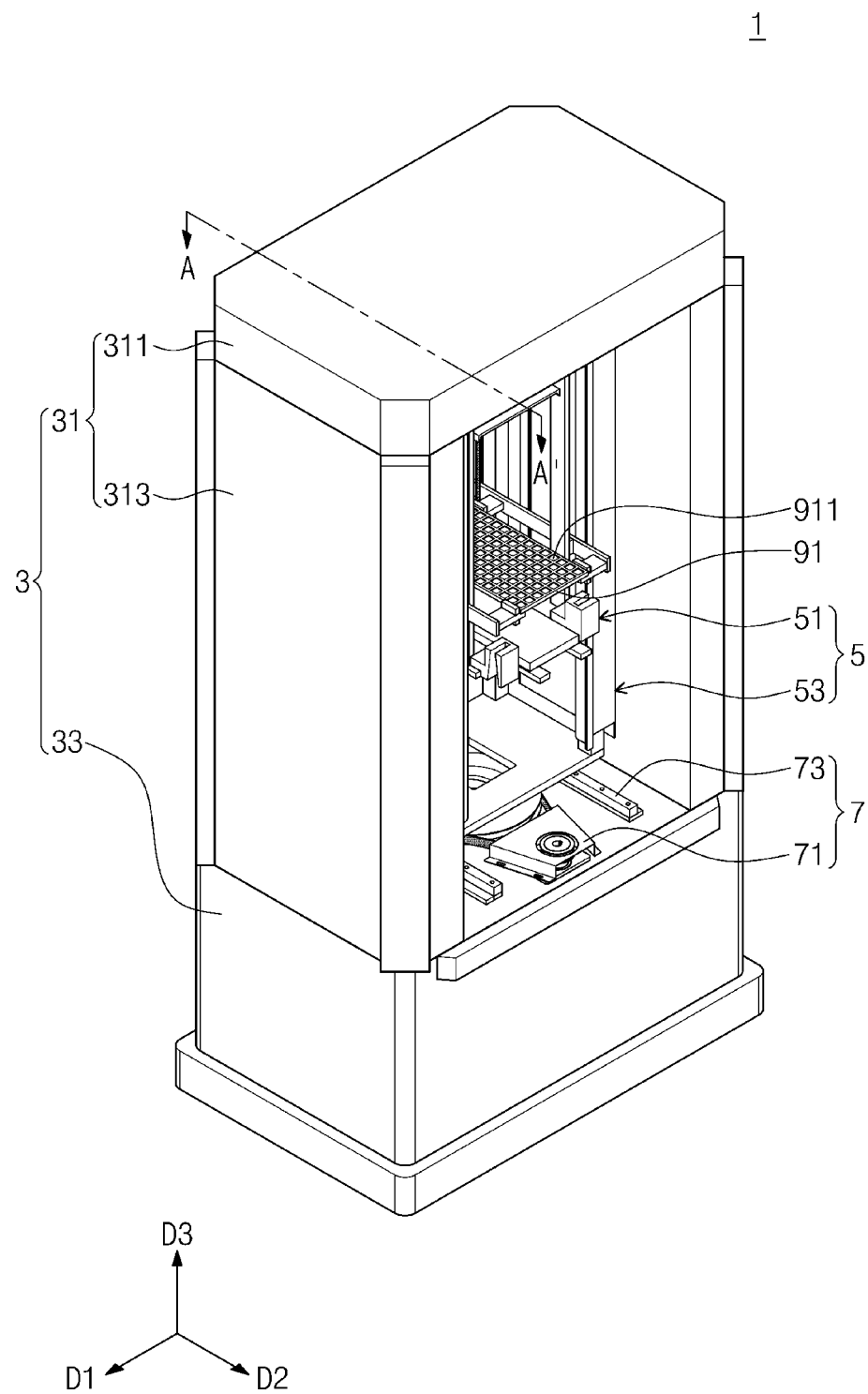
FIG. 2 is a perspective view of an example of an automated guided vehicle according to the inventive concept.

Each of the fabrication facilities 8 may be configured to transfer, store, assemble, inspect, and/or test an article (91 in FIG. 2).

To any of these ends, each of the fabrication facilities 8 may include at least one port 81 at which the article 91 is loaded into the facility 8, from which the article 91 is unloaded from the facility 8, or at which the article 91 is temporarily held in the facility 8. However, such a dedicated port or ports 81 is/are optional. The automated guided vehicle 1 is operative to load an article 91 onto or unload an article 91 from the fabrication facility 8 as will be further described in more detail below.

A plurality of the fabrication facilities 8 arranged in a first direction D1 may establish one fabrication line. Another fabrication line may be spaced in a second direction D2 from the one fabrication line.

As one example, the article 91 may be a semiconductor wafer. As another example, the article 91 may comprise a tray (911 of FIG. 2) on which is disposed at least one chip-level semiconductor device. However, the article delivered by the automated guided vehicle 1 is not limited to either of these articles. The article 91 may be any good or processed or unprocessed device required for delivery or further processing.

The automated guided vehicle 1 may load or unload the article 91 on or from a port 81 of a fabrication facility 8, while the automated guided vehicle 1 remains in a space between the fabrication lines. Alternatively, the automated guided vehicle 1 may load or unload the article 91 directly into or from a region at which a process takes place, while the automated guided vehicle 1 remains in a space between the fabrication lines.

FIG. 2 illustrates an example of the automated guided vehicle 1 according to the inventive concept.

Referring to FIG. 2, the automated guided vehicle 1 may include a vehicle body 3, a receptor 5 installed on one side of the vehicle body 3 and receiving the article 91, and a control mechanism 7 controlling a position of the receptor 5 relative to the vehicle body 3.

In some examples, the vehicle body 3 includes a drive mechanism 33 that moves the automated guided vehicle 1 and an outer housing 31 that is positioned on one side of the drive mechanism 33 and partially or completely surrounds the receptor 5.

The drive mechanism 33 may include a moving means that moves the automated guided vehicle 1 and a power means that provides the moving means with power. The moving means may be a wheel, a caterpillar track, etc. The power means may be a motor, an engine, or the like.

In some examples, the drive mechanism 33 is positioned below the outer housing 31, and may move while contacting a floor. However, the drive mechanism 33 is not limited to these examples. For example, the drive mechanism 33 may be positioned on a lateral side of the outer housing 31 and may move along the fabrication line, while contacting the fabrication facilities 8. Alternatively, the drive mechanism 33 may be positioned above the outer housing 31 and move along a ceiling.

The outer housing 31 may be connected to one side of the drive mechanism 33 and may partially or completely cover the receptor 5, thereby protecting the receptor 5. The outer housing 31 may be shaped like a rectangular hexahedron. The shape of the outer housing 31, however, is not limited to that shown in the figure and described above.

The outer housing 31 may include a cover 311 at its top side and lateral side members 313 extending downward from the cover 311.

The cover 311 may partially or completely cover other components of the automated guided vehicle 1, thereby protecting components of the automated guided vehicle 1.

In some examples, the lateral side members 313 may be two sheet-like members at opposite sides of the automated guided vehicle 1 so as to define therebetween a space in which the receptor 5 is accommodated. The space may be open in the second direction D2 and in a direction opposite to the second direction D2, and thus be open to the outside. The receptor 5 may load and unload the article 91 in the second direction D2 or the direction opposite to the second direction D2 without rotation of the automated guided vehicle 1.

In other examples, the lateral side member 313 are four pillars extending downward from fourth corners (or from vicinities of four corners) of the cover 311. In this example, the receptor 5 may load and unload the article 91 in the first direction D1, a direction opposite to the first direction D1, the second direction D2, or the direction opposite to the second direction D2 without rotation of the automated guided vehicle 1.

The receptor 5 may include a loader 51 on which the article 91 is loaded, an inner housing 53 protecting the loader 51, and a height adjuster (see 55 of FIG. 3A) controlling a height of the loader 51 relative to the inner housing 53.

Figure 3A:
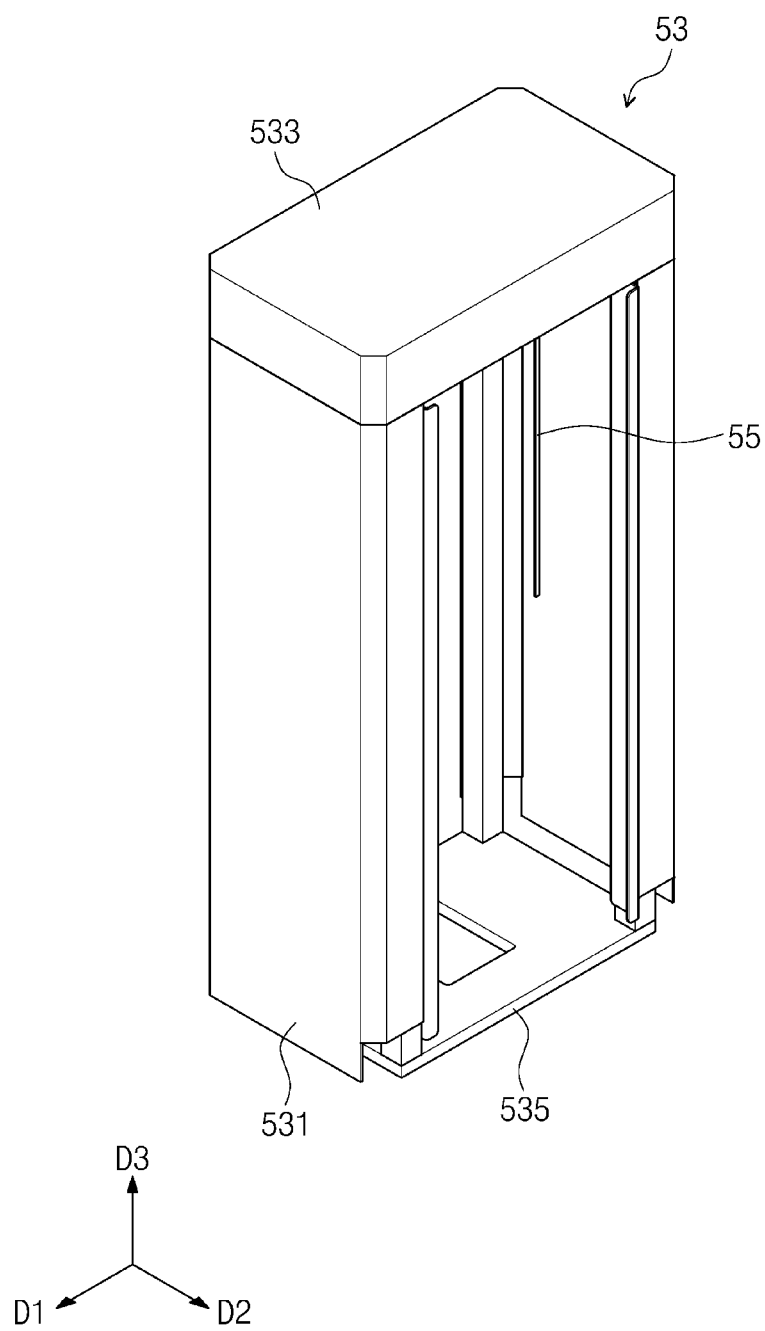
FIG. 3A is a perspective view of an inner housing of the automated guided vehicle shown in FIG. 2 according to the inventive concept.
Figure 3B:
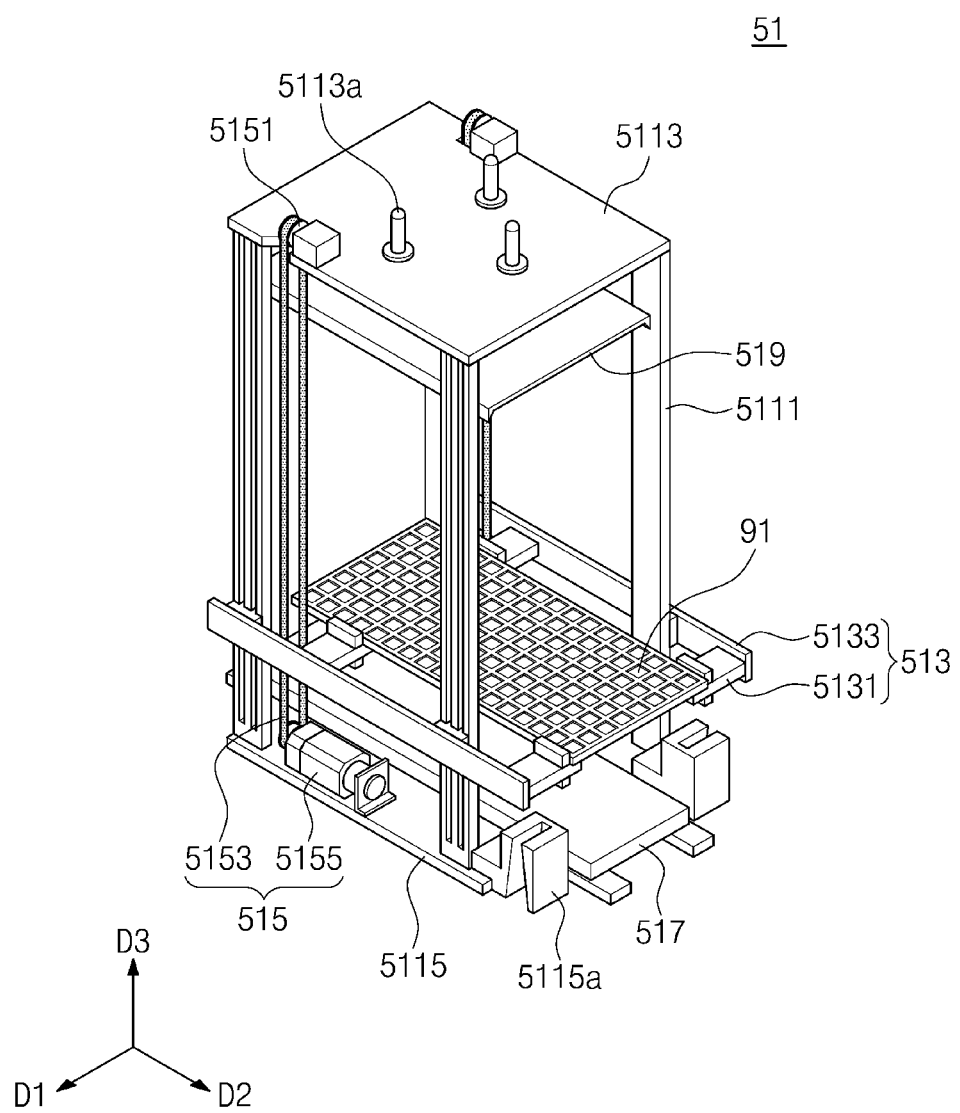
FIG. 3B is a perspective view showing a loader of the automated guided vehicle shown in FIG. 2 according to the inventive concept.

FIG. 3A is a perspective view of examples of the inner housing 53 and the height adjuster 55 according to the inventive concept. FIG. 3B is a perspective view of an example of the loader 51 according to the inventive concept.

Referring to FIGS. 2 and 3A, the inner housing 53 may surround the loader 51. The inner housing 53 may include a top plate 533 at its top side, a bottom plate 535 at its bottom side, and a supporting frame 531 that connects the top and bottom plates 533 and 535 to each other.

The top plate 533 may partially or completely cover the loader 51. The top plate 533 may have a rectangular shape. The shape of the top plate 533 is not limited to that shown in the figures and described above.

In some examples, a rotational radius $r1$ of the receptor 5 about a center (C in FIG. 10) of the top plate 533 may be less than half $r2$ the length of the shorter side (311 in FIGS. 2 and 10) of the cover. Thus, when the receptor 5 rotates, the receptor 5 does not protrude outward from the vehicle body 3. In particular, even if the receptor 5 is rotated, the receptor 5 will not collide with neighboring apparatus when the automated guided vehicle 1 is moving along a fabrication line. A more detailed explanation of this aspect of the inventive concept will be discussed below.

In some examples, the top plate 533 may be detachably connected to the loader 51. A more detailed explanation of this aspect of the inventive concept will be discussed below as well.

The bottom plate 535 may support the receptor 5. The bottom plate 535 may have an area similar to that of the top plate 533. The bottom plate 535 may be rotatable and when the bottom plate 535 rotates about its axis of rotation, a rotational radius r1 of the receptor 5 may be less than the half r2 of the smaller edge length of the cover (see 311 of FIGS. 2 and 10).

The bottom plate 535 may be movably connected to the control mechanism 7. In some examples, the bottom plate 535 is detachably connected to a rotation unit 71 (FIGS. 2 and 4) of the control mechanism 7, which control mechanism 7 may allow the bottom plate 535 to rotate. In some examples, the bottom plate 535 may be detachably connected to a guiding unit (73 in FIGS. 2 and 4) of the control mechanism 7, which guiding unit 73 may allow the bottom plate 535 to horizontally move back and forth. A more detailed explanation of this aspect of the inventive concept will be discussed below as well.

The supporting frame 531 may extend from the top plate 533 toward the bottom plate 535.

In some examples, the supporting frame 531 may be a pair of sheet-like members. The two members of the supporting frame 531 may be spaced apart in the first direction D1 at a predetermined distance and may accommodate the loader 51 therebetween. A space between the two supporting frames 531 may be open in the second direction D2 and/or the direction opposite to the second direction D2, and thus spatially open to the outside. The receptor 5 may load and unload the article 91 in the second direction D2 or the direction opposite to the second direction D2 without rotation of the vehicle body 3.

In other examples, the supporting frame 531 comprises four column-like members extending downward from the four corners (or vicinities of four corners) of the top plate 533, respectively. The four column-like members of the supporting frame 531 may be spaced apart at a predetermined distance and may accommodate the loader 51 therebetween. A space between the four column-like members of the supporting frame 531 may be opened in the first direction D1, the direction opposite to the first direction D1, the second direction D2, and the direction opposite to the second direction D2, and thus spatially open to the outside. The receptor 5 may load and unload the article 9 in the first direction D1, the direction opposite to the first direction D1, the second direction D2, or the direction opposite to the second direction D2 without rotation of the vehicle body 3.

Referring to FIG. 3B, in this example, the loader 51 includes a main framework, a loading unit 513 that separately accommodates the article 91, an elevating unit 515 that moves the loading unit 513, an entry unit 517 through which the article 91 is loaded on or unloaded from the automated guided vehicle 1, and a pressing unit 519 that presses the article 91 to fix the article in place on the loading unit 513.

The main framework may include a top frame 5113 at its top, a bottom frame 5115 at its bottom, and a longitudinal frame 5111 extending in the third direction D3 between the top and bottom frames 5113 and 5115.

The top frame 5113 may be detachably connected to the top plate 533 of the inner housing 53. The top frame 5113 may comprise a rectangular plate. The shape of the top frame 5113 is not limited to being rectangular, though. The top frame 5113 may also include a fixing means 5113a that fixes a position of the loader 51 when the loader 51 is connected to the inner housing 53.

In some examples, the fixing means 5113a may extend at a predetermined length in the third direction D3 from a top surface of the plate of the top frame 5113. The fixing means 5113a may be connected to the inner housing 53 when the loader 51 moves upward, thereby fixing the position of the loader 51. The top plate 533 of the loader 51 may be provided therein with an aperture into which the fixing means 5113a is received.

Referring to FIG. 3B, the fixing means 5113a may comprise three fixing members, e.g., pins. The number of fixing members of the fixing means 5113a is not limited, however.

Each member of the fixing means 5113a may have a shape whose width progressively decreases toward its top end. The fixing means 5113a may guide the loader 51 into an exact position even if there is a slight error in position when the inner housing 53 is connected to the loader 51 that moves upward. The shape of the fixing means 5113a is not limited to that shown in the figures and described above, however. For example, the member(s) of the fixing means 5113a may each have the same horizontal cross-section at its top and bottom ends.

The bottom frame 5115 may have a shape similar to that of the top frame 5113. The shape of the bottom frame 5115, however, is not limited to that shown in the figures and described above. The bottom frame 5115 may include a positioning means 5115a at one side thereof. When the loader 51 approaches a fabrication facility (8 in FIGS. 11 to 14), the positioning means 5115a may guide the loader 51 into a position for loading or unloading the article 91. The bottom frame 5115 may fix the loader 51 at a specific position above the fabrication facility 8. The positioning means 5115a may be a member defining an aperture extending in the third direction D3. The aperture may have a shape whose width progressively decreases toward its top end. When the loader 51 moves downward and becomes fixed to the fabrication facility 8, the positioning means 5115a may guide the loader 51 into an exact position even if there is a slight error in an initial position of the loader 51. The loader 51 and the fabrication facility 8 may be connected to each other with a precise positional relationship therebetween.

In some examples, the positioning means 5115a may have two aperture-defining members at the front of the loader 51. The inventive concept, however, is not limited to the positioning means 5115a shown in the figures and describe above; rather, other examples of the positioning means 5115a are possible.

The longitudinal frame 5111 may extend from the top frame 5113 toward the bottom frame 5115. Referring to FIG. 3B, the longitudinal frame 5111 may be provided in the form of four bars spaced apart from each other at a predetermined distance. The shape and number of the bars or of the longitudinal frame 5111, however, are not limited to those shown in the figures and described above.

In some examples, the loading unit 513 is supported by the longitudinal frame 5111 so as to be slidable up and down along the longitudinal frame 5111. The loading unit 513 is configured to accommodate the article 91. In some examples, the loading unit 513 has one side connected to the elevating unit 515 and an opposite side supported by the longitudinal frame 5111. The loading unit 513 may include a loading means 5131 in contact with the article 91 and a connecting means 5133 through which the loading means 5131 and the elevating unit 515 are connected to each other.

In some examples, the loading means 5131 may comprise a plate oriented horizontally to accept the article 91 thereon. The shape of the loading means 5131, however, is not limited to that shown in the figures and described above. Rather, the loading means 5131 may have any shape suitable for stably supporting the article 91 loaded thereon.

In some examples, the connecting means 5133 may be provided at its opposite ends with two supports of the loading means 5131 arranged in the second direction D2. The loading means 5131 may rigidly support the article 91. The inventive concept, however, is not limited to the loading means 5131 shown in the figures and described above. Rather, there are no limitations on the shape and number of members constituting the loading means 5131, as long as the article 91 can maintain its balance on the loading means 5131.

In some examples, the connecting means 5133 extends at a predetermined length in the second direction D2 and the direction opposite to the second direction D2. One side of the connecting means 5133 may be fixed to an elevating band 5153 of the elevating unit 515, which elevating band 5153 will be discussed below. The other side of the connecting means 5133 may be slidably connected to the longitudinal frame 5111. When the elevating band 5153 moves up and down, the connecting means 5133 may move up and down along the longitudinal frame 5111.

In some examples, two loading units 513 are provided as arranged in the first direction D1 and the direction opposite to the first direction D1. The two loading units 513 may stably support respective articles 91. The loading units 513 may be fixed relative to each other so as to reside at the same level.

In some examples, more than one set of the two loading units 513 may be provided. That is, several sets of two loading units 513 may be arranged in the third direction D3 along the longitudinal frame 5111. The loader 51 may separately accommodate three or more bundles of the articles 91. The inventive concept, however, is not limited to any particular number of sets of loading units in either the first or third directions. A procedure of loading articles into the vehicle, which is readily applicable to any of these examples, will be further described below in more detail with reference to FIGS. 5 to 8.

The elevating unit 515 may drive the loading unit 513 up and down. In some examples, the elevating unit 515 includes an elevating drive means 5155, an elevating band 5153 connected to the elevating drive means 5155, and an elevating frame 5151 connected to the elevating band 5153.

The elevating drive means 5155 may provide a driving force to circulate the elevating band 5153. Referring to FIG. 3B, the elevating drive means 5155 may be provided in the form of a motor below the loader 51. The inventive concept, however, is not limited to the elevating drive means shown in the figures and described above. For example, the elevating drive means 5155 may be positioned elsewhere in the loader 51 than at the location shown in FIG. 3B. The elevating drive means 5155 may have devices other than the motor for generating the driving forces for moving the loading unit 513 up and down.

The elevating band 5153 may be connected to the connecting means 5133 and may drive the loading unit 513 to up and down. The elevating band 5153 may be connected to the elevating drive means 5155 and may be provided with a driving force. The elevating frame 5151 may reverse the direction of movement of the elevating band 5153. The use of the elevating band 5153 may save the space occupied by the loader 51 and thus minimize the volume of the loader 51. The use of the elevating band 5153 may minimize the overall weight of the elevating unit 515. The use of the elevating band 5153 may optimize efficiency in terms of the amount of energy required to move the elevating unit 515.

The elevating frame 5151 may be disposed on top of the loading frame, which frame 5151 may reverse the direction in which the elevating band 5153 extends and thus moves when driven. In some examples, the elevating frame 5151 has the form of a pulley fixed in place.

In other examples, the elevating unit 515 comprises rack and pinion gears to covert a rotational movement of the elevating drive means 5155 into an up-and-down linear movement. The elevating unit 515 can have various other mechanisms that drive the loading unit 513 up and down.

The entry unit 517 may load the article 91 on the automated guided vehicle 1 and unload the article 91 from the automated guided vehicle 1. In some examples, the entry unit 517 is positioned above the bottom frame 5115. The entry unit 517 may include a robot arm (5171 of FIG. 14).

The robot arm 5171 may have a double arm structure. The structure and method of operation of the robot arm 5171 will be discussed below with reference to FIG. 14.

The pressing unit 519 may press the article 91 loaded on the loading unit 513, and thus rigidly hold the article 91 at a specific position. The pressing unit 519 may be provided below the top frame 5113. The position of the pressing unit 519, however, is not limited to that described above.

Referring to FIGS. 5 to 8, the pressing unit 519 may include a pressing plate 5191 that is to contact the article 91 and a pressing means 5193 that drives the pressing plate 5191 up and down.

In some examples, the pressing plate 5191 is a wide plate oriented horizontally. The pressing plate 5191 may uniformly press and hold the article 91 in place. The pressing plate 5191 may have an area greater than that of the largest one of the articles 91 to be loaded. The pressing plate 5191 may stably press variously sized articles 91.

In some examples, the pressing means 5193 connects the pressing plate 5191 to the top frame 5113. The pressing means 5193 may provide the pressing plate 5191 with a force to press the article 91. Referring to FIGS. 5 to 8, the pressing means 5193 may extend and retract onto and off of the article 91. The pressing means 5193 may provide the pressing plate 5191 with a force to press the article 91 under a state in which the pressing plate 5191 is in contact with the article 91.

Referring back to FIGS. 2, 3A, and 3B, the height adjuster 55 may adjust the height of the loader 51 relative to the inner housing 53. In some examples, the height adjuster 55 is connected to the top plate 533 of the inner housing 53 and to the top frame 5113 of the loader 51. The inventive concept, however, is not limited to this particular arrangement of the height adjuster 55 and inner housing 53.

In some examples, the height adjuster 55 is formed of a flexible wire. The height adjuster 55 may flexibly respond to a slight positional error occurring when the positioning means 5115a and a counter-positioning means (811 of FIGS. 11 to 14) are connected when the loader 51 moves downward, with the result that the positional error may be corrected by the height adjuster 55. The height adjuster 55 is not limited to being in the form of a wire. Rather, the height adjuster 55 may have other forms capable of adjusting a relative height between the loader 51 and the height adjuster 55.

Figure 4:
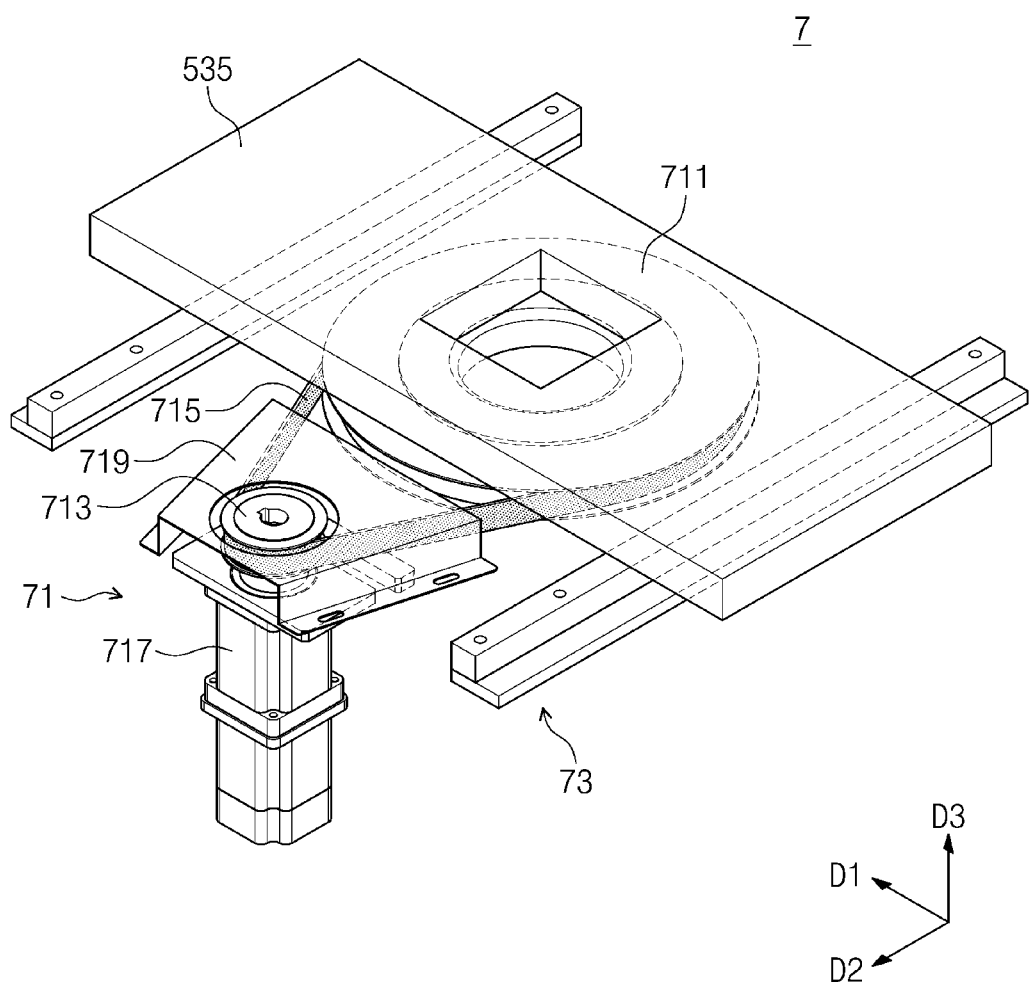
FIG. 4 is a perspective view of a controller of the automated guided vehicle shown in FIG. 2 according to the inventive concept.

Referring to FIGS. 2 and 4, as was mentioned above the control mechanism 7 may include a rotation unit 71 that rotates the receptor 5 and a guide unit 73 along which the receptor 5 can move horizontally.

In some examples, the rotation unit 71 is interposed between the drive mechanism 33 and the bottom plate 535. The rotation unit 71 may include a rotating drive means 717 providing a rotational force, a large toothed wheel 711 (e.g., a gear or sprocket) connected to the receptor 5, a small toothed wheel 713 (e.g., a gear or sprocket) connected to the rotating drive means 717, a band 715 connecting the large toothed wheel 711 and the small toothed wheel 713 to each other, and a protective cover 719.

The rotating drive means 717 may be a motor. In some examples, the rotating drive means 717 is positioned on a location spaced apart at a predetermined distance from a rotational center of the receptor 5. In such a configuration, the drive mechanism 33 below the receptor 5 may secure a space where the power means and the moving means are installed. In addition, since the rotating drive means 717 is connected to the receptor 5 through the toothed wheels 711 and 713 having different sizes from each other, the rotating drive means 717 may have a great mechanical advantage in rotating the receptor 5.

The large toothed wheel 711 may be positioned below the bottom plate 535 of the receptor 5. The large toothed wheel 711 has teeth at its circumference engaged with the band 715 in the form of a chain. A pulley having a flat outer surface and a band whose inner surface is flat, e.g., a rubber belt, may be used instead of the large toothed wheel 711 and band (chain) 715.

The small toothed wheel 713 may be connected to the rotating drive means 717. The small toothed wheel 713 has a radius less than that of the large toothed wheel 711. The small toothed wheel 713 has teeth at its circumference engaged with the rotating band 715 shaped like a chain. A pulley having a flat outer surface and a band whose inner surface is flat, i.e., the aforementioned rubber belt, for example, may be used instead of the small toothed wheel 713 and band (chain) 715.

The protective cover 719 may partially or completely cover the rotation unit 71. The protective cover 719 may protect the rotation unit 71 when the receptor 5 moves back and forth along the guide unit 73.

The guide unit 73 may disposed on and mounted to the drive mechanism 33. In other examples, the guide unit 73 is positioned on an inner surface of the outer housing 31, e.g., on a bottom surface of the cover 311 (FIG. 2).

The guide unit 73 may comprise a rail or pair of rails as shown. The receptor 5 may be provided with a means, such as a wheel, that can move along the rail(s).

In an example of the automated guided vehicle according to the inventive concept, as shown in FIGS. 5-8, the loader has two loading units 513. The two loading units 513 may be arranged in the third direction D3. Each of the two loading units 513 may have two sets of the loading means 5131. A procedure in which the loader 51 loads the article 91 in a multistage manner will now be described with reference to FIGS. 5 to 8.

Figure 5:
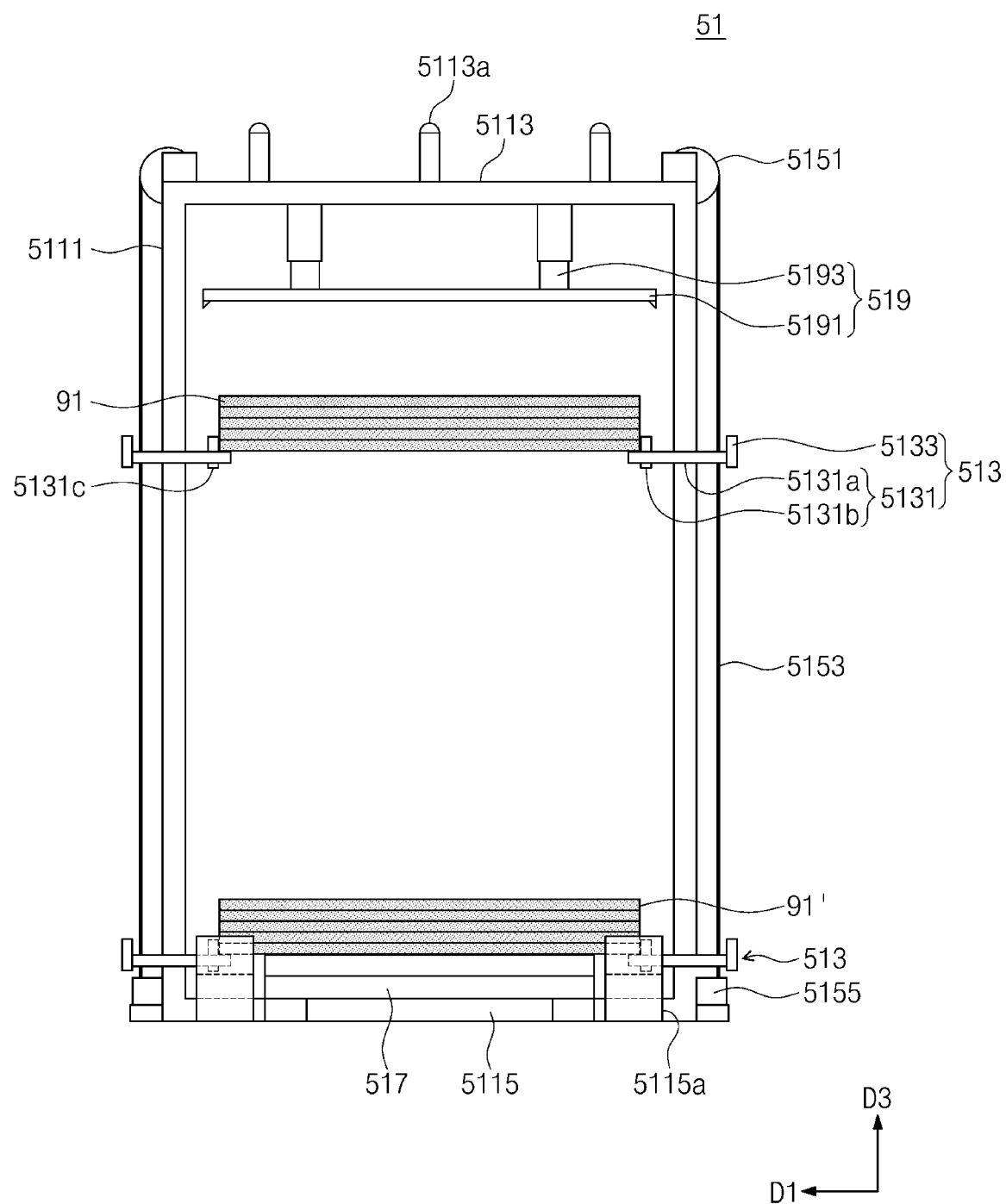
FIGS. 5, 6, 7 and 8 are front views of the loader of the automated guided vehicle shown in FIG. 2 according to the inventive concept showing a procedure for multistage loading of articles on a receptor of the automated guided vehicle.

In this procedure, referring to FIG. 5, the article 91 may be placed on the loading means 5131 of an upper one of the two upper loading units 513. A lower one of the two loading means 513 may be temporarily held at the bottom of the loader 51. A new article 91' may be on standby on the entry unit 517. At this time, the lower loading unit 513 is positioned at the bottom of the loader 51, e.g., beside the entry unit 517

Figure 6:
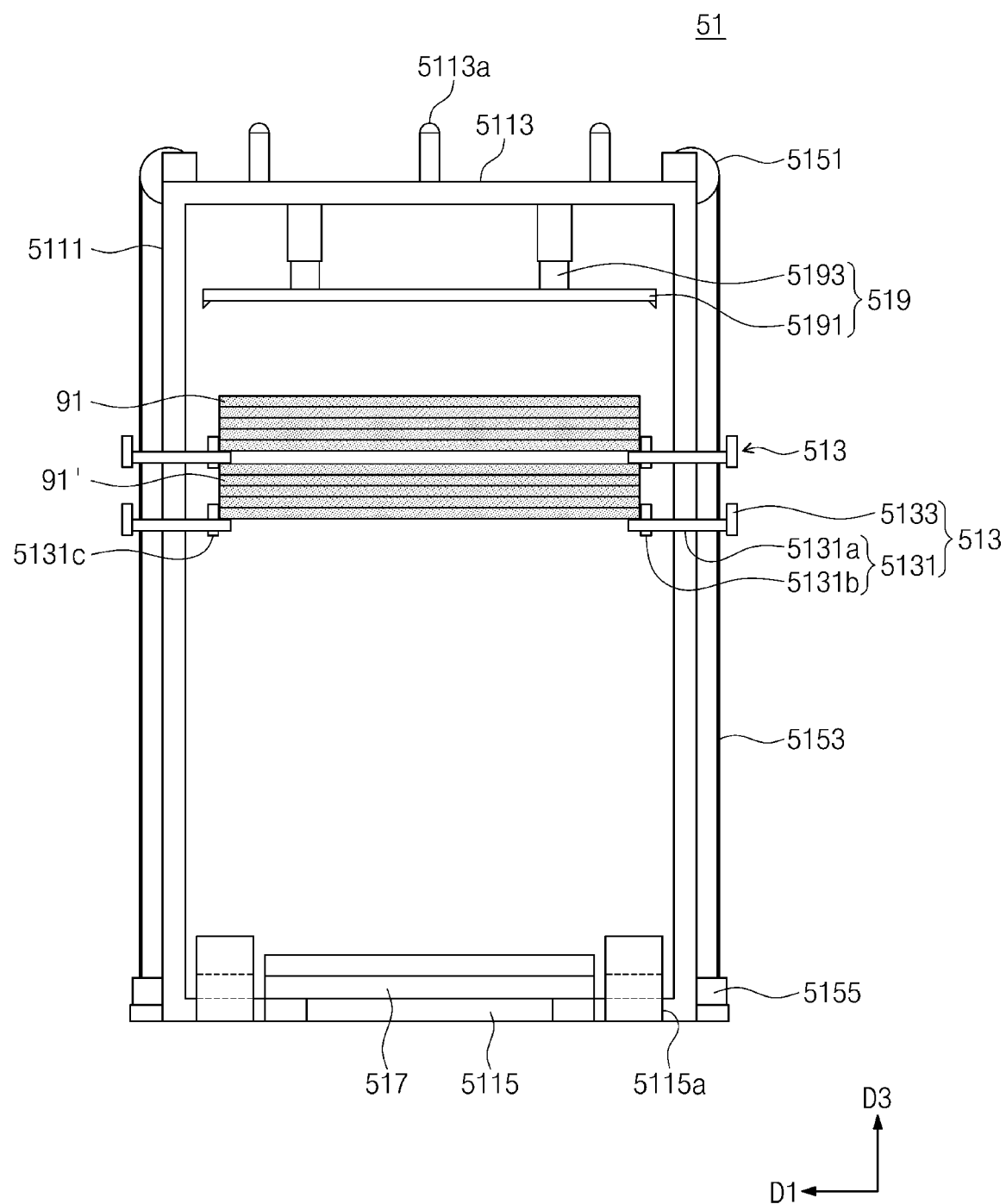

Referring to FIG. 6, the lower loading unit 513 may be raised, i.e., moved in the third direction D3. The new article 91' held on the entry unit 517 is received by the lower loading unit 513 and moved in the third direction D3 when the lower loading unit 513 is raised.

The loading means 5131 may have a loading plate 5131a and a sensor 5131b at one side thereof. The loading means 5131 at an opposite side thereof may have a reflecting plate 5131c. The reflecting plate 5131c may receive light or ultrasonic waves emitted from the sensor 5131b. The reflecting plate 5131c may reflect the light or ultrasonic wave toward the sensor 5131b. When the new article 91' loaded on the loading means 5131 of the lower loading unit 513 enters between the sensor 5131b and the reflecting plate 5131c, the light or ultrasonic waves traveling between the sensor 5131b and the reflecting plate 5131c is/are interrupted by the new article 91'. In that case, the loading means 5131 of the lower loading unit 513 is stopped. Therefore, the new article 91' is prevented from colliding with the loading means 5131 of the upper loading unit 513.

Figure 7:
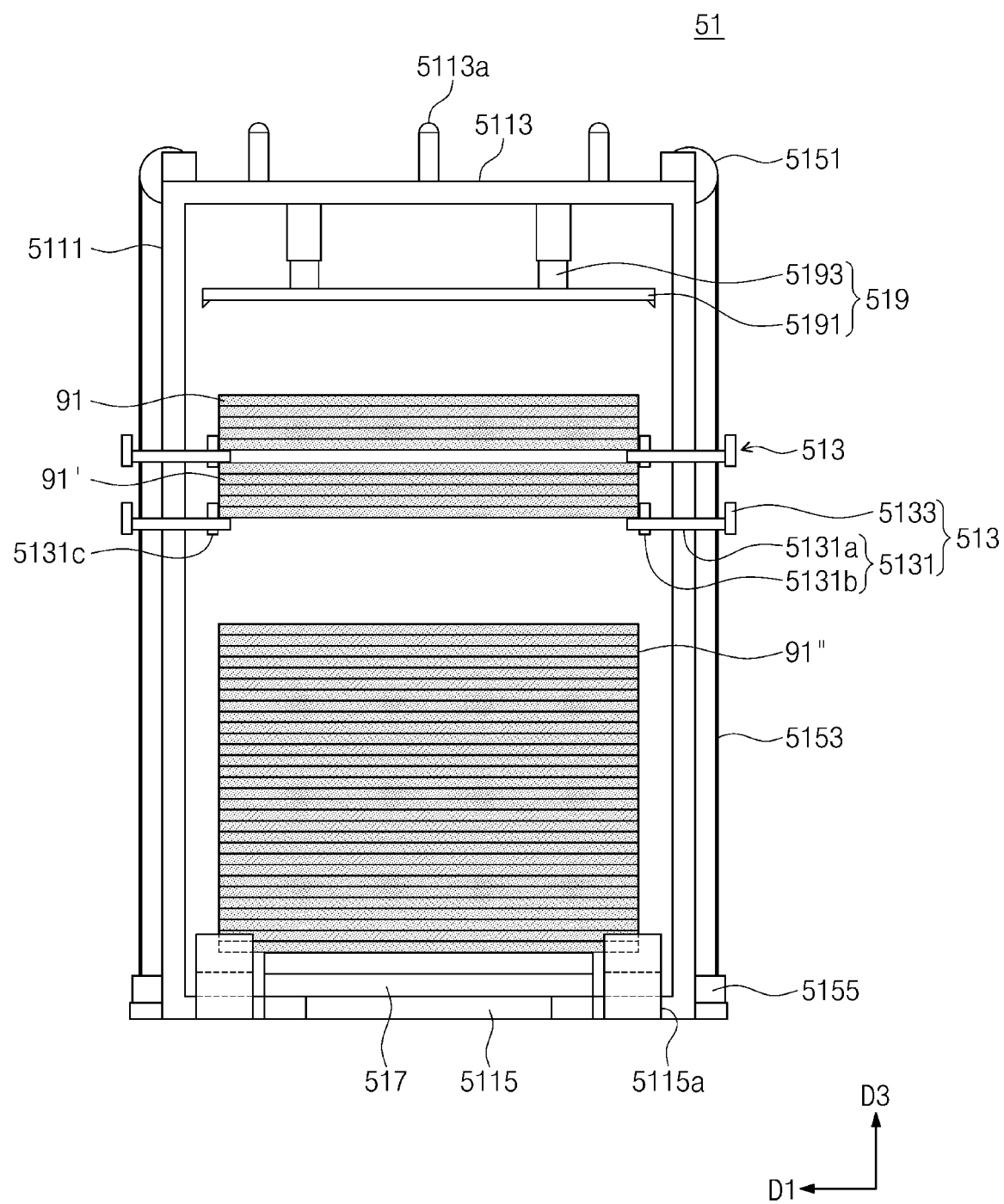

Referring to FIG. 7, another article 91" may be newly introduced and held on the entry unit 517. If the loader 5 is provided with another loading unit 513, the remaining loading unit 513 may be positioned and raised to repeat the steps discussed with reference to FIGS. 5 and 6. However, if no more (unoccupied) loading units 513 are present as illustrated in FIG. 7, the new article 91" is stored on the entry unit 517.

Figure 8:
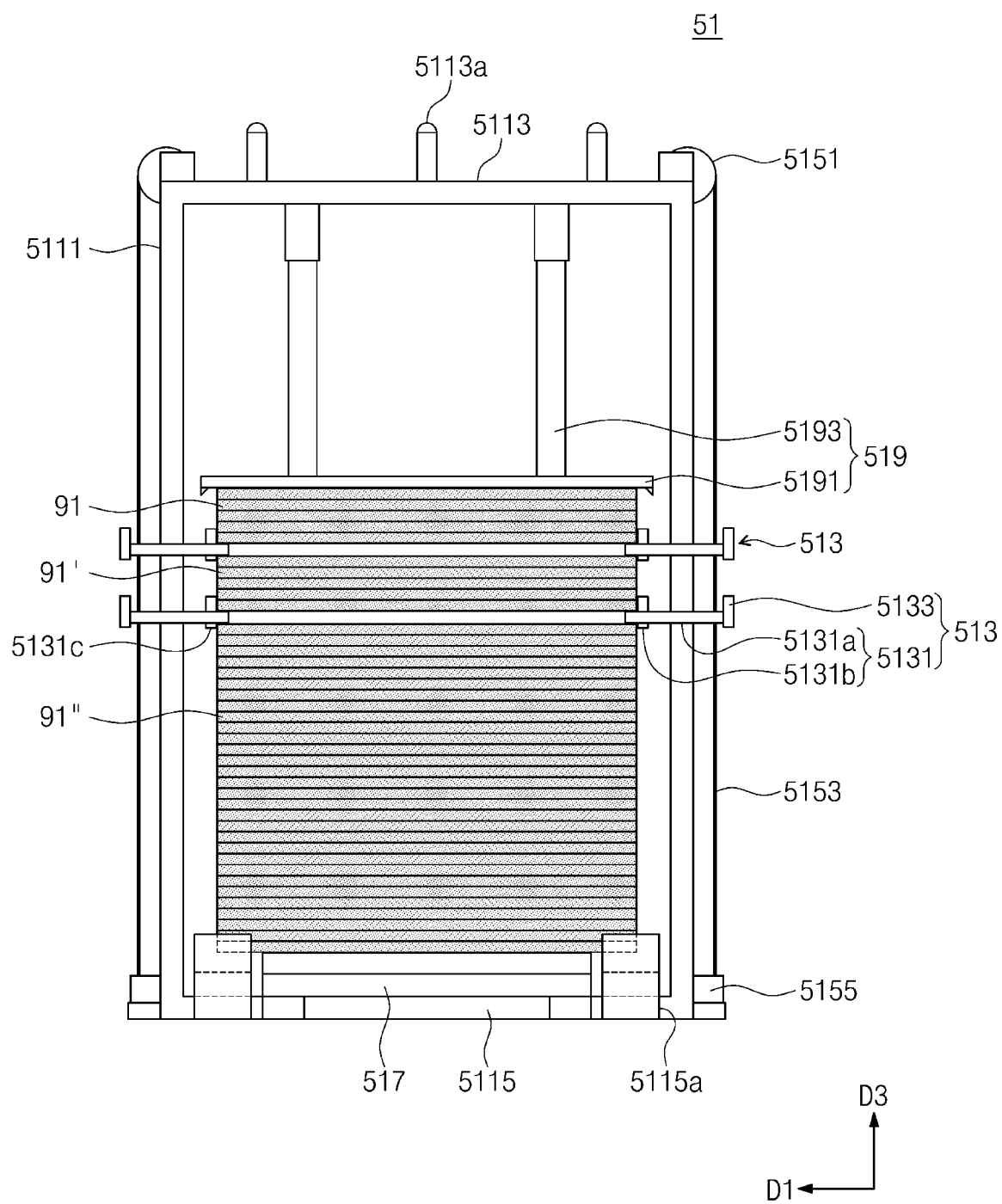

Referring to FIG. 8, the upper and lower loading units 513 are lowered to positions as follows. The lower loading unit 513 may be lowered to a position at which it presses and thereby holds the new article 91" against the entry unit 517. The upper loading unit 513 may be lowered to a position at which it presses and thereby holds the article 91' against the lower loading unit 513.

In some examples, the pressing means 5193 may be extended to move the pressing plate 5191 downward. The pressing plate 5191 may press the article 91 initially loaded on the loading means 513 of the upper loading unit 513.

The articles 91, 91', and 91" may clamped by and between by the loading means 5131, the pressing plate 5191 and the entry unit 517. Thus, each of the articles 91, 91', and 91" may be rigidly held in place. Accordingly, the articles 91, 91', and 91" may be prevented from dislocation and/or damage caused by vibration and/or slight collisions occurring when the automated guided vehicle 1 is moved.

Figure 9:
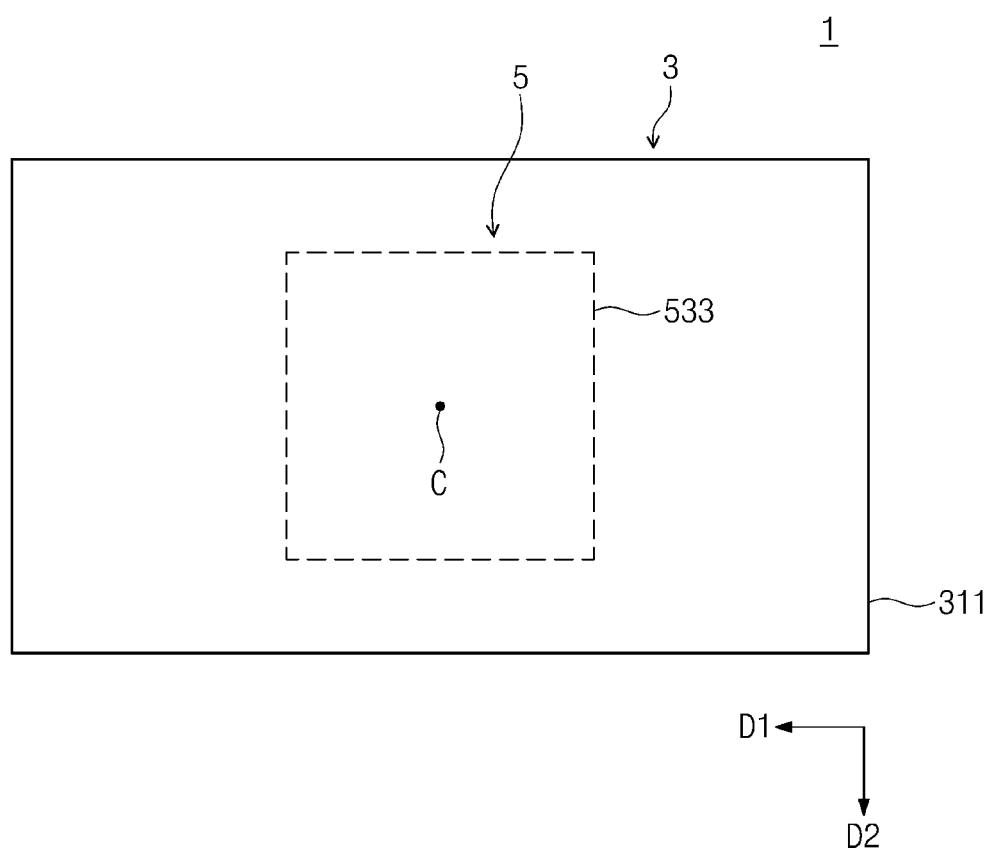
FIGS. 9 and 10 are plan views of a receptor of the automated guided vehicle shown in FIG. 2 according to the inventive concept showing a procedure for rotating the receptor.
Figure 10:
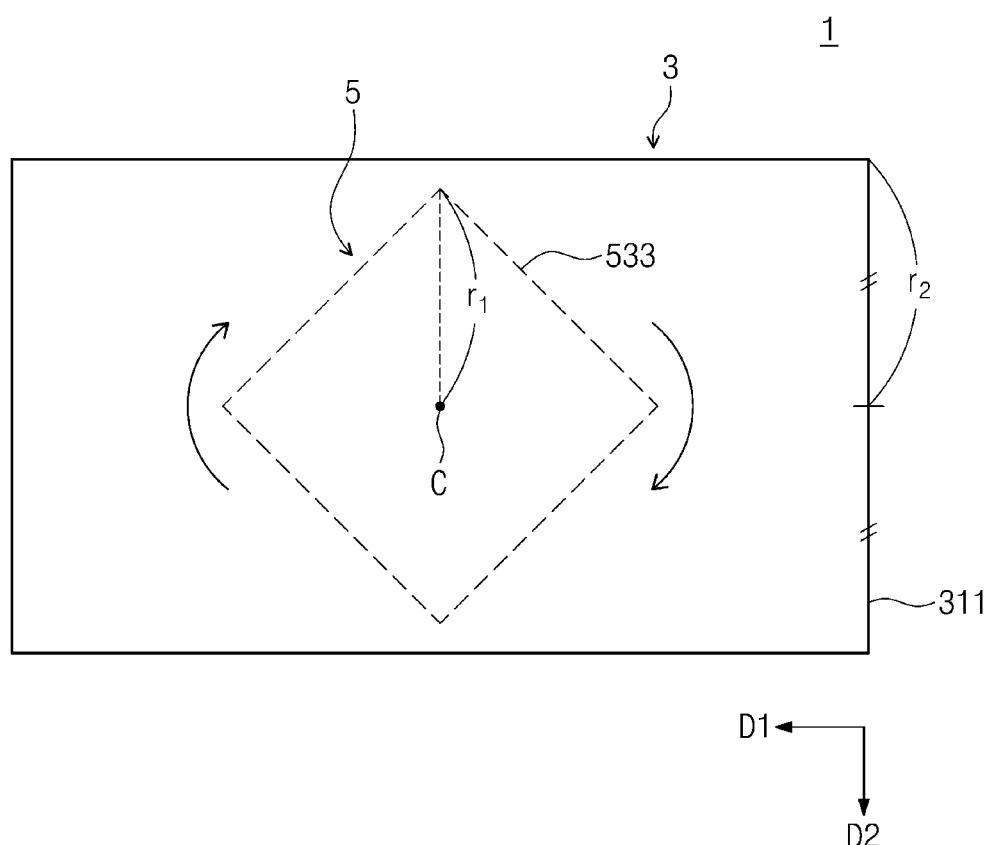

FIGS. 9 and 10 are plan views of an automated guided vehicle 1 according to the inventive concept.

Referring to FIG. 9, a dotted line indicates the receptor 5 at a bottom of the vehicle body 3. In this state, the receptor 5 is not rotated from a home position but is in a state of rotational alignment with the vehicle body 3.

Referring to FIG. 10, the receptor 5 is shown as rotated from its home position by about 45 degrees. A rotational radius r1 of the receptor 5 may be less than half r2 of the width (the length of the smaller side) of the vehicle body 3. In some examples, the receptor 5 does not protrude outward from the vehicle body 3 in any rotational position of the receptor 5 relative to the vehicle body 3. As such, even when the receptor 5 rotates during operation and movement of the automated guided vehicle 1, the receptor 5 will not collide with other neighboring vehicles traveling along a fabrication line in an opposite direction, for instance. Accordingly, the article 91 will not be damaged. Moreover, this arrangement helps to minimize the footprint of the automated guided vehicle 1 and thus the fabrication lines may be efficiently arranged which, in turn, improves the economics behind the manufacturing facility.

FIGS. 11 to 14 show a procedure for loading or unloading the articles 91 on or from the fabrication facility 8 using the receptor 5.

Referring to FIGS. 11 to 14, in this example, the fabrication facility 8 includes one or more ports 81 on which the article 91 is temporarily held. In some examples, each of the ports 81 may be provided at one side with a counter-positioning means 811 to be connected to the positioning means 5115a. In other examples, the fabrication facility 8 is not provided with a port or ports 81 but is still provided at one side with a counter-positioning means 811 to be connected to the positioning means 5115a.

Figure 11:
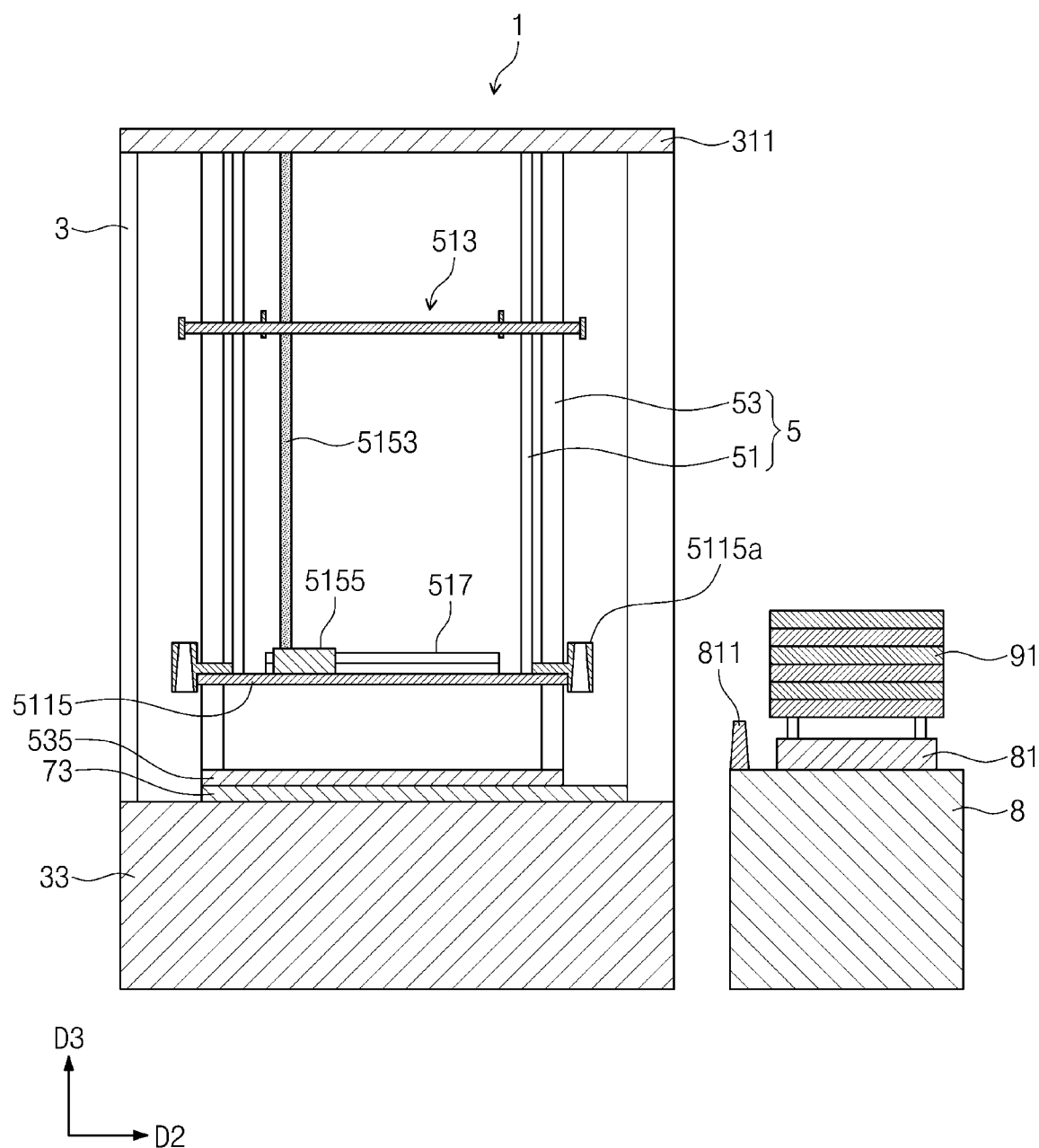
FIGS. 11, 12, 13 and 14 are cross-sectional views of the loader taken along line A-A' of FIG. 2, showing a procedure for loading or unloading of articles on or from a fabrication line using a receptor of the automated guided vehicle according.

Referring to FIG. 11, the automated guided vehicle 1 is on standby in front of the fabrication facility 8. In some cases of standby, an article may be on the loader 51. In other cases, as illustrated in FIG. 11, no article is present on the loader 51.

Figure 12:
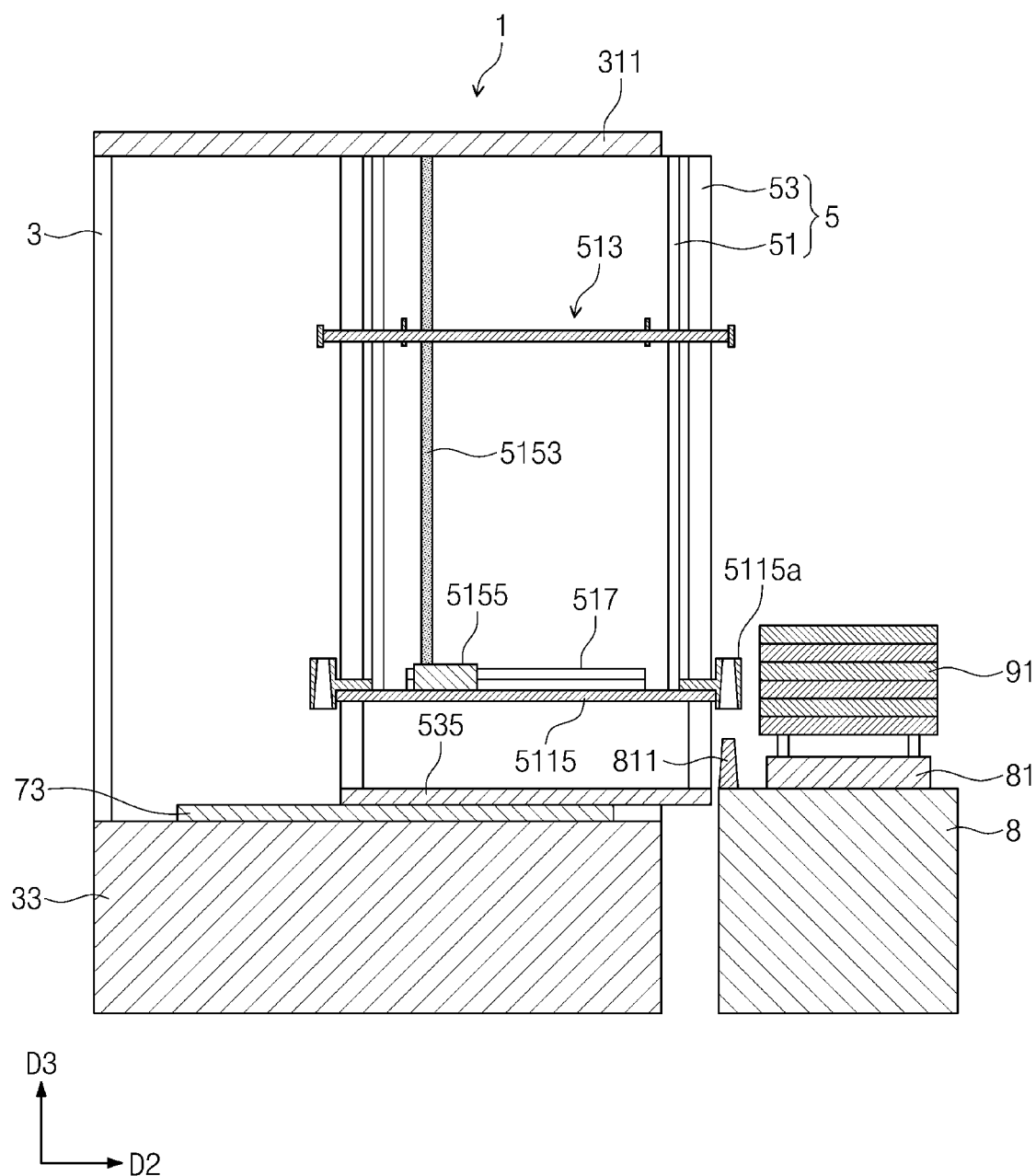

Referring to FIG. 12, the receptor 5 is driven in the second direction D2 along the guide unit 73. At this time, the receptor 5 may protrude from the vehicle body 3.

Figure 13:
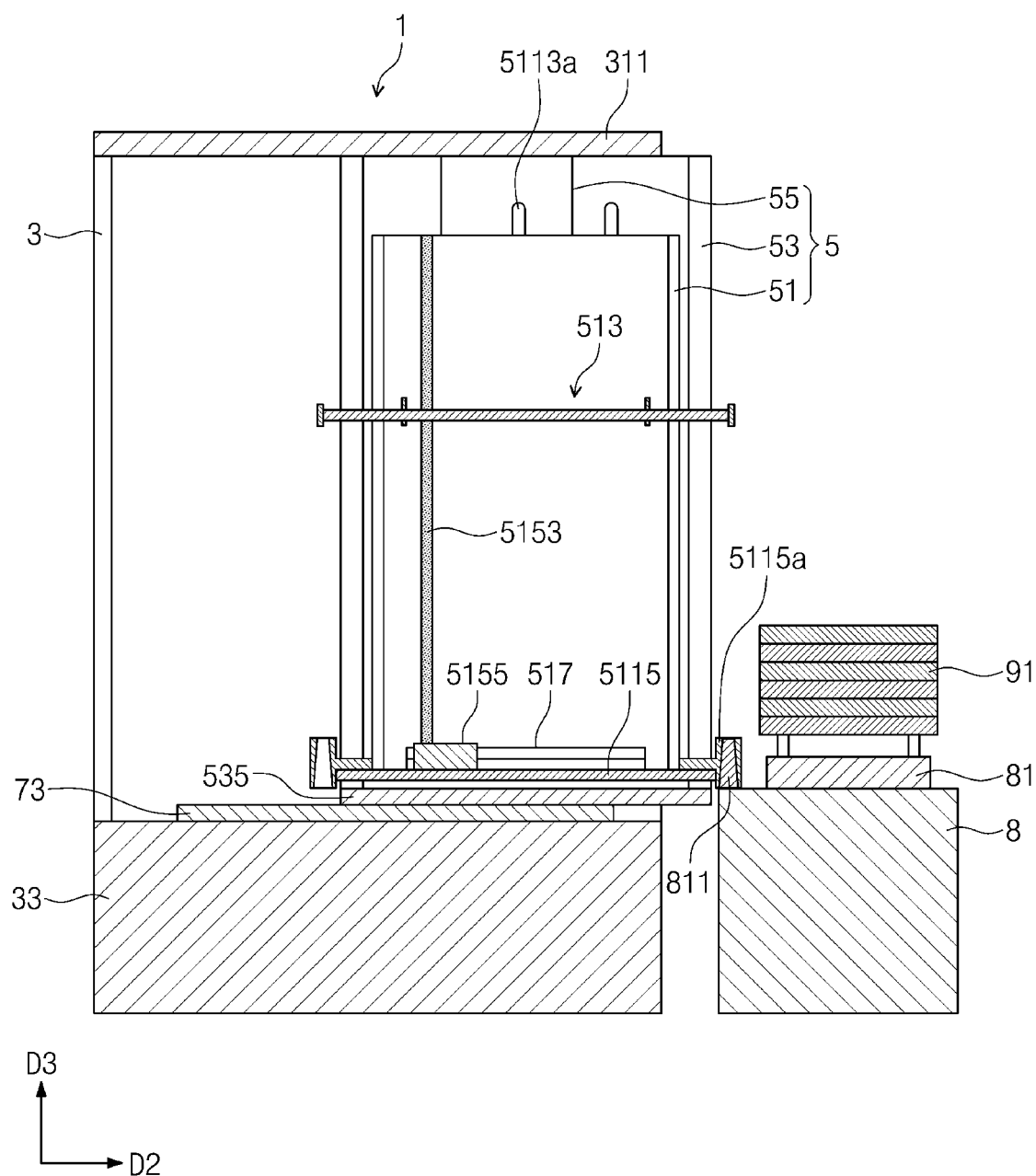

Referring to FIG. 13, the height adjuster 55 lowers the loader 51, i.e., moves the loader 51 in the direction opposite to the third direction D3 in the figure. At this time, the fixing means 5113a may be disengaged from the inner housing 53.

The loader 51 is lowered until the counter-positioning means 811 is inserted into the positioning means 5115a provided on the bottom frame 5115. In some examples as was described above, the positioning means 5115a may have an aperture whose width gradually decreases toward its top end. Even when the positioning means 5115a is initially positioned improperly on the counter-positioning means 811, the positioning means 5115a may be guided into an exact position during a downward movement of the loader 51 and thus precisely connected to the counter-positioning means 811.

In some examples as was described above, the height adjuster 55 comprises a flexible wire. The flexible wire may allow for a positional adjustment of the loader 51 relative to the inner housing 53 occurring when the positioning means 5115a is guided into an exact position during a downward movement of the loader 51.

Figure 14:
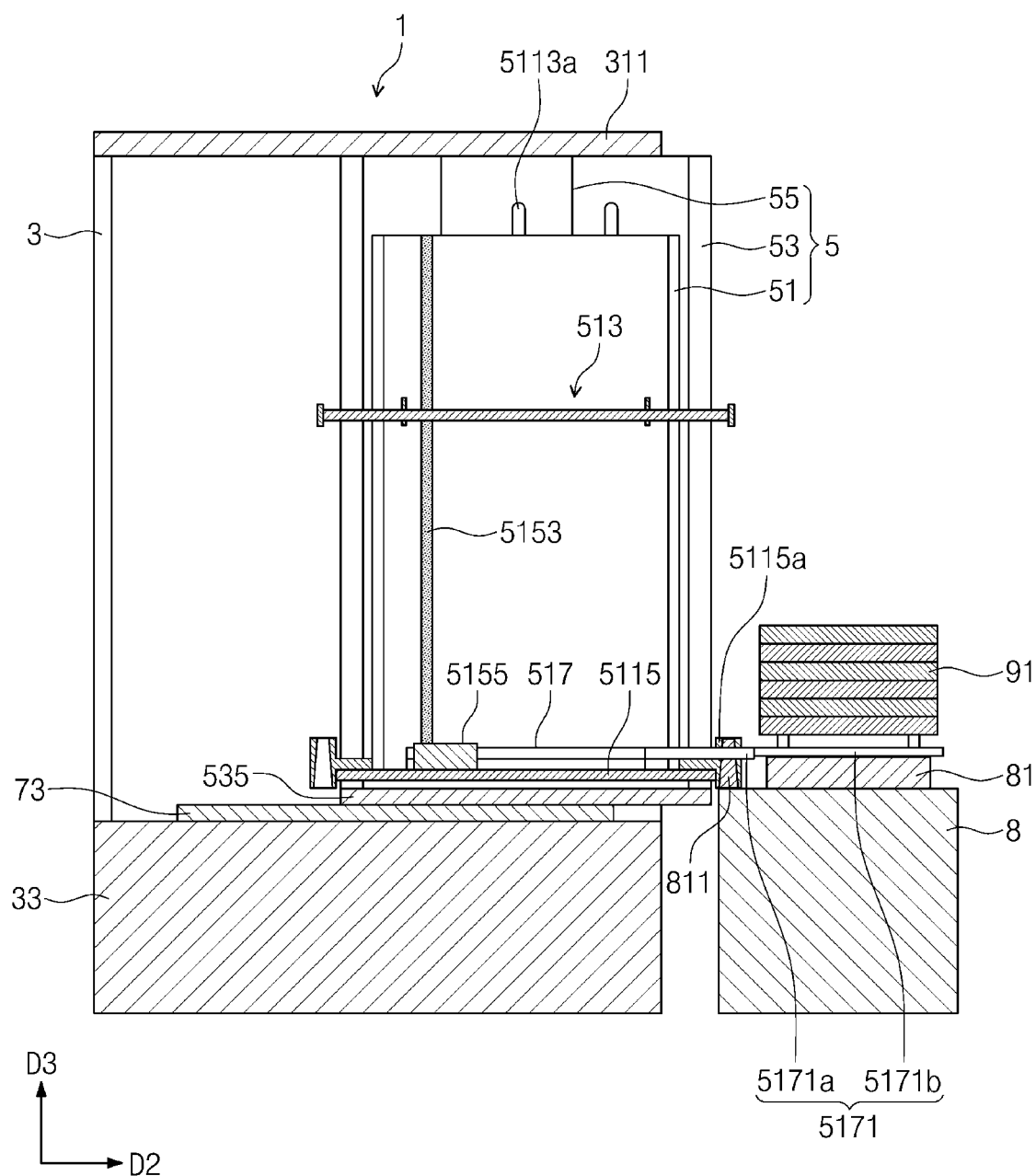

Referring to FIG. 14, after the positioning means 5115a is precisely fitted to the counter-positioning means 811, the robot arm 5171 may be extended out of the entry unit 517. The robot arm 5171 may be inserted below the article 91 held on the port 81.

In some examples, the robot arm 5171 has a double arm structure, i.e., a first arm 5171a and a second arm 5171b.

A subsequent process may be performed in the reverse order of the steps discussed with reference to FIGS. 11 to 14.

The robot arm 5171 loaded with the article 91 may return toward the loader 51. The robot arm 5171 may load the article 91 on the entry unit 517. Subsequently, as discussed with reference to FIGS. 5 to 8, the article 91 may be rigidly held in place.

The height adjuster 55 may raise the loader 51, i.e., may move the loader 51 in the third direction D3. At this time, the fixing means 5113a at the top side of the loader 51 may be inserted into the top plate 533 of the inner housing 53. The loader 51 may be rigidly fixed on one side of the inner housing 53.

The receptor 5 may then be moved along the guide unit 73 in the direction opposite to the second direction D2. The receptor 5 may thus be retracted into the vehicle body 3.

When the steps mentioned above are completed, the automated guided vehicle 1 may be ready to move toward another port 81.

In some examples, when the article 91 is loaded on the receptor 5, the positioning means 5115a and the counter-positioning means 811 may promptly and easily place the loader 51 on a specific position. In some examples, the positioning means 5115a and the counter-positioning means 811 may rigidly fix the loader 51 on a specific position. It may be possible to prevent in advance vibration and error occurred when the receptor 5 loads and unloads the article 91.

In some examples, the automated guided vehicle 1 equipped with the positioning means 5115a is used with a facility 8 carrying out semiconductor device processing. In some examples, the automated guided vehicle 1 equipped with the positioning means 5115a is used with a facility 8 carrying out a semiconductor device packaging processes. In the packaging processes, a wafer-level semiconductor device may be divided into a plurality of semiconductor chips. A plurality of the semiconductor chips may be conveyed while being loaded on a tray 911 (FIG. 2). The semiconductor chips on the tray 911 may be misaligned or damaged even if only subjected to slight vibrations or a shock due to a collision between part of the automated vehicle 1 and another object. The use of the positioning means 5115a and/or other components discussed allow for relative positions of the semiconductor chips to be maintained and prevent damage of the semiconductor chips. As a result, it may be possible to increase a process speed and to improve a process yield.

According to an aspect of the inventive concept, an automated guided vehicle with multistage loading structure may be configured not only to separately load articles having different sizes, but also to have a vehicle body with a minimal footprint (horizontal cross section).

In addition, the automated guided vehicle may be configured to load and unload the article in various manners by rotating the article without rotating the vehicle body.

Furthermore, the automated guided vehicle may be configured to preventing articles from vibrating or being moved out of position when the articles are loaded and unloaded.

The inventive concept is not limited to the aspects mentioned above; rather other effects which have not been mentioned above will be readily apparent to those skilled in the art from the foregoing description.

Although the inventive concept has been described in connection with examples illustrated in the accompanying drawings, it will be understood by those skilled in the art that various changes and modifications may be made without departing from the technical spirit and essential feature of the inventive concept. It therefore will be understood that the examples described above are just illustrative but not limitative.

What is claimed is:

1. An automated guided vehicle, comprising:
a vehicle body comprising a drive mechanism configured to move the automated guided vehicle; and
a loader that is positioned on the vehicle body and that loads articles in a multistage manner,
wherein the loader comprises
an adjuster configured to vary a vertical position of the loader relative to the vehicle body, and
a positioning means configured to be connected to a counter-positioning means that is present in a vicinity of a location where the articles are loaded and unloaded, wherein the adjuster comprises a flexible wire positioned on a top side of the loader that moves the loader up and down.

2. The automated guided vehicle of claim 1, further comprising a guide unit along which the loader moves relative to the vehicle body,
wherein, when the articles are loaded and unloaded, the guide unit guides the loader into an outward position relative to the vehicle body.

3. The automated guided vehicle of claim 1, wherein the positioning means has a shape having a width that decreases toward a top end of the positioning means.

4. The automated guided vehicle of claim 1, wherein the loader further comprises an entry unit where the articles are loaded and unloaded,
wherein the entry unit comprises a robot arm configured to protrude outward from the vehicle body.

5. The automated guided vehicle of claim 4, wherein the robot arm is configured to have a double arm.

6. The automated guided vehicle of claim 1, wherein the loader rotates relative to the vehicle body.

7. The automated guided vehicle of claim 1, wherein the loader further comprises a plurality of loading units that are positioned between the articles loaded in the multistage manner and that separately load the articles,
wherein the plurality of loading units move up and down.

8. An automated guided vehicle comprising:
a vehicle body comprising a drive mechanism configured to move the automated guided vehicle;
an outer housing on top of the drive mechanism;
a receptor disposed within the outer housing, and configured to store articles; and
a guide unit along which the receptor moves relative to the vehicle body to a position outside the outer housing, the receptor comprising
an inner housing,
a loader disposed within the inner housing and that loads the articles in a multistage manner,
a flexible wire that varies a vertical position of the loader within the inner housing, and
a positioning member disposed on the loader and having an aperture configured to be connected to a counter-positioning member that is present in a vicinity of a location where the articles are loaded and unloaded.

9. The automated guided vehicle of claim 8, wherein the aperture has a width that decreases toward an inner end of the aperture.

10. The automated guided vehicle of claim 8, wherein the loader further comprises an entry unit that loads and unloads the articles,
wherein the entry unit comprises a robot arm configured to protrude outside the outer housing.

11. The automated guided vehicle of claim 10, wherein the robot arm comprises a double arm structure having a first arm and a second arm.

12. The automated guided vehicle of claim 8, further comprising a control mechanism disposed within the outer housing and configured to rotate the loader relative to the vehicle body.

13. The automated guided vehicle of claim 8, wherein the loader further comprises a plurality of loading units that are positioned between the articles loaded in the multistage manner and that separately load the articles,
wherein the plurality of loading units are configurable to move up and down.

14. The automated guided vehicle of claim 8, wherein the loader further comprises a loading unit on which an article from among the articles is loaded, wherein the loading unit is configurable to move up and down.

15. The automated guided vehicle of claim 14, wherein the loader further comprises a pressing plate configurable to move up and down and to press and hold the article from among the articles on the loading unit.

* * * * *